United States Patent
Hong

(10) Patent No.: US 9,293,469 B2
(45) Date of Patent: Mar. 22, 2016

(54) FLASH MEMORY AND FABRICATION METHOD THEREOF

(71) Applicant: Semiconductor Manufacturing International (Shanghai) Corporation, Shanghai (CN)

(72) Inventor: Zhongshan Hong, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/554,651

(22) Filed: Nov. 26, 2014

(65) Prior Publication Data

US 2015/0255473 A1    Sep. 10, 2015

(30) Foreign Application Priority Data

Mar. 4, 2014    (CN) .......................... 2014 1 0076930

(51) Int. Cl.
| | |
|---|---|
| *H01L 21/00* | (2006.01) |
| *H01L 27/115* | (2006.01) |
| *H01L 21/027* | (2006.01) |
| *H01L 21/033* | (2006.01) |
| *H01L 21/285* | (2006.01) |
| *H01L 21/3213* | (2006.01) |
| *H01L 29/06* | (2006.01) |
| *H01L 29/45* | (2006.01) |
| *H01L 29/49* | (2006.01) |
| *H01L 29/66* | (2006.01) |
| *H01L 29/788* | (2006.01) |

(52) U.S. Cl.
CPC ...... *H01L 27/11521* (2013.01); *H01L 21/0276* (2013.01); *H01L 21/0332* (2013.01); *H01L 21/0337* (2013.01); *H01L 21/28518* (2013.01); *H01L 21/28568* (2013.01); *H01L 21/32133* (2013.01); *H01L 21/32139* (2013.01); *H01L 29/0653* (2013.01); *H01L 29/45* (2013.01); *H01L 29/4916* (2013.01); *H01L 29/665* (2013.01); *H01L 29/66515* (2013.01); *H01L 29/66825* (2013.01); *H01L 29/788* (2013.01); *H01L 29/7883* (2013.01)

(58) Field of Classification Search
CPC ..................... H01L 27/11521; H01L 29/7883; H01L 29/45; H01L 21/32133
See application file for complete search history.

(56) References Cited

U.S. PATENT DOCUMENTS

| | | | | |
|---|---|---|---|---|
| 5,589,413 | A * | 12/1996 | Sung | ................. H01L 27/11521 257/E21.682 |
| 5,953,612 | A * | 9/1999 | Lin | ................... H01L 21/28052 257/E21.004 |
| 2002/0074592 | A1* | 6/2002 | Abedifard | ......... H01L 27/11521 257/315 |

(Continued)

*Primary Examiner* — Laura Menz
(74) *Attorney, Agent, or Firm* — Anova Law Group, PLLC

(57) ABSTRACT

A flash memory fabrication method includes: providing a substrate having a plurality of floating gate structures separated by trenches, which includes at least a source trench and a drain trench, and source/drain regions; forming a metal film on the substrate and on the floating gate structures; performing a thermal annealing process on the metal film to form a first silicide layer on the source regions and a second silicide layer on the drain regions; removing portions of the metal film to form a metal layer on the bottom and lower sidewalls of the source trench and contacting with the first silicide layer, and forming a dielectric layer on the substrate and the floating gate structures, covering the source trench and the drain trench. Further, the method includes forming a first conducting structure and one or more second conducting structures in the dielectric layer. The first conducting structure is on the metal layer in the source trench, the second conducting structures are on the second silicide layer, and adjacent first conducting structure and second conducting structure have a predetermined distance.

14 Claims, 9 Drawing Sheets

(56) References Cited

U.S. PATENT DOCUMENTS

2015/0187780 A1* 7/2015 Chiu ............... H01L 27/11521
      257/316
2015/0187781 A1* 7/2015 Hong ............... H01L 27/11521
      257/316
2015/0255473 A1* 9/2015 Hong ............... H01L 21/0276
      257/316

* cited by examiner

FLASH MEMORY AND FABRICATION METHOD THEREOF

CROSS-REFERENCES TO RELATED APPLICATIONS

This application claims the priority of Chinese patent application no. CN201410076930.5, filed on Mar. 4, 2014, the entire contents of which are incorporated herein by reference.

FIELD OF THE INVENTION

The present invention relates to the field of semiconductor manufacturing technology and, more particularly, relates to flash memory and a flash memory fabrication method.

BACKGROUND

In current semiconductor industry, IC products may be classified into three categories: analog circuits, digital circuits, and digital/analog hybrid circuits. Memory device is an important type of the digital circuits. In recent years, memory device especially the flash memory is developed very fast. The main feature of the flash memory is its nonvolatile property where data may be stored for a long time without a power supply. As a result, the flash memory is widely used in areas where dada needs to be kept during a power off state, and/or where dada needs to be read/written frequently. Besides, the flash memory has the advantages such as high degree of integration, fast reading and writing speed, ease of erasing and rewriting, etc. Thus, the flash memory is often extensively used in microprocessor and electronic systems and automation industries. Thereby, it is important to improve the performance and to reduce the cost of the flash memory.

EPROM Tunnel Oxide (ETOX) NOR flash memory is a high performance flash memory. A cell of the NOR flash memory often includes a floating gate structure on top of a substrate, a source region located on one side of the floating gate structure, and a drain region located on the other side of the floating gate structure. Further, the floating gate structure includes a tunnel oxide layer formed on the top of the substrate, a floating gate layer formed on the surface of the tunnel oxide layer, an insulation layer formed on the surface of the floating gate layer, and a control gate layer formed on the surface of the insulation layer.

As the development of high density flash memory, which is being used as the storage media in portable electronics such as digital cameras, laptops, and tablets, performance of the portable electronics increases significantly. Reducing flash memory's cost by shrinking the feature size of the flash units is a trend in the current flash memory technologies. Currently, for the ETOX NOR flash memory, the conducting structures on the surface of the source and drain regions may be formed by a self-aligned contact process, thus to satisfy the needs of making even smaller sized flash memory.

However, the conducting structures formed on the surface of the source and drain regions through the self-aligned process may still possibly cause the flash memory to have poor performance and low reliability and stability. The disclosed methods are directed to solve one or more problems set forth above and other problems.

BRIEF SUMMARY OF THE DISCLOSURE

One aspect of the present disclosure includes a flash memory fabrication method. The method includes providing a substrate having a plurality of floating gate structures separated by trenches, which includes at least a source trench and a drain trench. The source regions are formed in the substrate at bottom of the source trench and drain regions are formed in the substrate at bottom of the drain trench. The method also includes forming a metal film on the substrate and on the floating gate structures; performing a thermal annealing process on the metal film to diffuse metal ions of the metal film into the substrate to form a first silicide layer on the source regions and a second silicide layer on the drain regions. The method also includes removing portions of the metal film to form a metal layer on the bottom and lower sidewalls of the source trench and contacting with the first silicide layer, and forming a dielectric layer on the substrate and the floating gate structures, the dielectric layer covering the source trench and the drain trench. Further, the method includes forming a first conducting structure and one or more second conducting structures in the dielectric layer. The first conducting structure is on a surface of the metal layer in the source trench, the second conducting structures are on a surface of the second silicide layer, and adjacent first conducting structure and second conducting structure have a predetermined distance.

Another aspect of the present disclosure provides a flash memory. The flash memory includes a substrate having a plurality of floating gate structures separated by trenches, which includes at least a source trench and a drain trench. The source regions are formed in the substrate at bottom of the source trench and drain regions are formed in the substrate at bottom of the drain trench. The flash memory also includes a metal layer on the bottom and lower sidewalls of the source trench, and a dielectric layer on the substrate and the floating gate structures covering the source trench and the drain trench. Further, the flash memory includes a first conducting structure and one or more second conducting structures in the dielectric layer. The first conducting structure is on a surface of the metal layer in the source trench, the second conducting structures are on a surface of the second silicide layer, and adjacent first conducting structure and second conducting structure have a predetermined distance.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

As illustrated in the background section, the conducting structures formed on the surface of the source or train regions by the self-aligned contact process may still cause the flash memory formed based on these conducting structures to have a poor performance, stability, and reliability.

Figure 1:
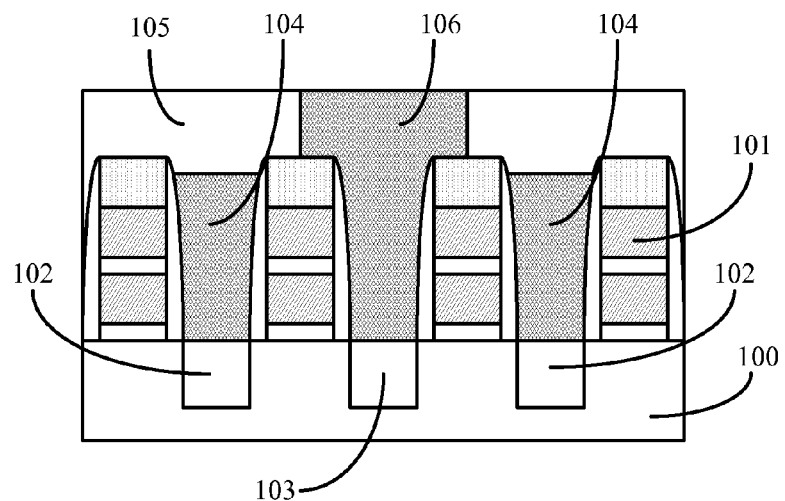
FIGS. 1-2 illustrate structures of an exemplary flash memory consistent with the disclosed embodiments.
Figure 2:
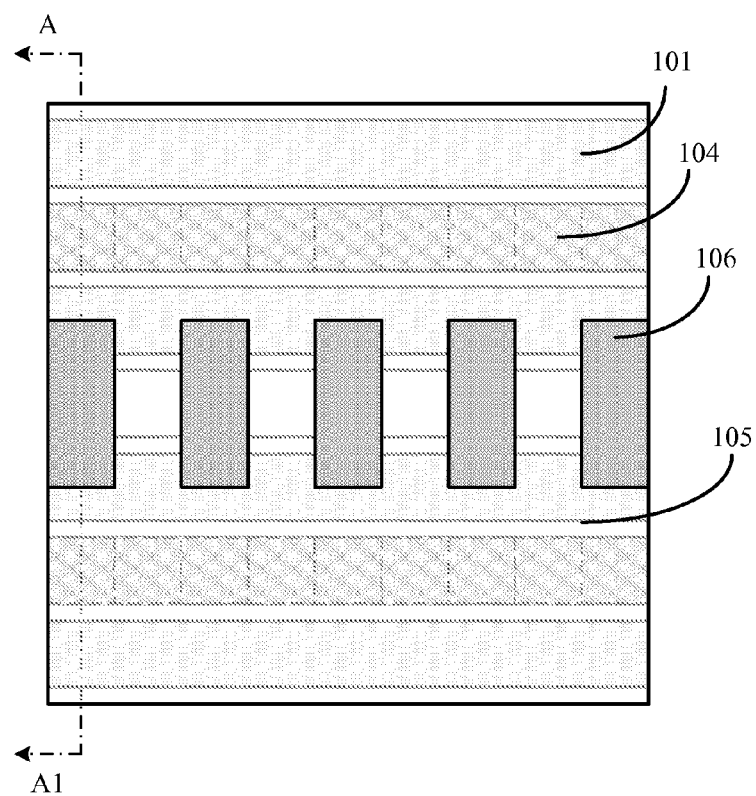

FIGS. 1-2 illustrate structures of an exemplary flash memory consistent with the present disclosure. FIG. 2 illustrates the top view the flash memory, and FIG. 1 illustrates the A-A1 sectional view of the flash memory.

As shown in FIGS. 1-2, the flash memory may include certain parallel floating gate structures 101 located on the surface of a substrate 100; certain source trenches and/or drain trenches located between the adjacent floating gate structures 101. Where the source trenches and the drain trenches may be arranged in an alternative way. That is one source trench may occur after one drain trench. Further, the flash memory may include certain insolated source regions 102 formed in the substrate 100 located at the bottom of the source trenches, and certain insolated drain regions 103 formed in the substrate 100 located at the bottom of the drain trenches. Besides for a pair of adjacent source trench and drain trench, one source region 102 located at the bottom of the source trench may have one corresponding drain region 103 located at the bottom the drain trench. Moreover, the flash memory may include a source wire 104 located inside the source trench that may electrically connect certain insulated source regions 102 located inside the source trench together. The flash memory may further include a dielectric layer 105 located on the surface of the floating gate structures 101, the source wires 104, and inside the drain trenches; and certain conducting structures 106 located in the dielectric layer 105. In addition, the conducting structures 106 may also be located on the surface of the drain regions 103, and may be used to apply an offset voltage to the drain regions 103.

Because the conducting structures 106 may be formed by a self-aligned silicide process, the conducting structures 106 may also be formed on the top surface of the floating gate structures 101 located on both sides of the drain trenches. Thus, the distance between the source wires 104 and the conducting structures 106 may be relatively small. During operation, dielectric material between the source wires 104 and the conducting structures 106 may breakdown because a large voltage potential difference the source wires 104 and the conducting structures 106, and may generate leakage current. Thus, the performance and reliability of the formed flash memory may decrease.

To solve the problem, the present disclosure provides a flash memory and a flash memory fabrication method. More specifically, a first silicide layer may be formed on the surface of the source regions by a self-aligned silicide process. A second silicide layer may be formed on the surface of the drain regions by a self-aligned silicide process. The first silicide layer and the second silicide layer may reduce the contact resistance on the surface of the source regions and the drain regions. After an annealing process belonging to the self-aligned silicide process, certain residual metal films may be left on the sidewalls and at the bottom of the source/drain trenches. The residual metal films may able to connect certain source regions located at the bottom of the source trenches together. Then, by removing the residual metals films located inside the drain trenches, while partially keeping the residual metal films located at the bottom and on the lower sidewalls of the source trenches, a metal layer may be formed. The formed metal layer may connect certain source regions located at the bottom of the source trenches together. That is, the formed metal layer may serve as the source wire of the flash memory.

Because the formed metal layer may be far from a second conducting structure located on the surface of the drain regions, and the formed metal layer may be insulated from the second conducting structure by the floating gate structures, the formed metal layer and the second conducting structure may be hard to generate electrical breakdown. Thus, the leakage current between the source wire of the storage device and the second conducting structure located on the surface of the drain regions may be avoided.

Further, because the formed metal layer may connect certain source regions located at the bottom of the source trenches together, positions of a first conducting structure that is to be formed on the surface of the metal layer may be chosen freely. Thus, the position of the first conducting structure and the position of a second conducting structure may not correspond to each other. Thereby, the distance between the first conducting structure and the second conducting structure may increase, and may avoid generating a leakage current due to the electrical breakdown of the dielectric material located between the upper portion of the first conducting structure and the upper portion of the second conducting structure.

Figure 15:
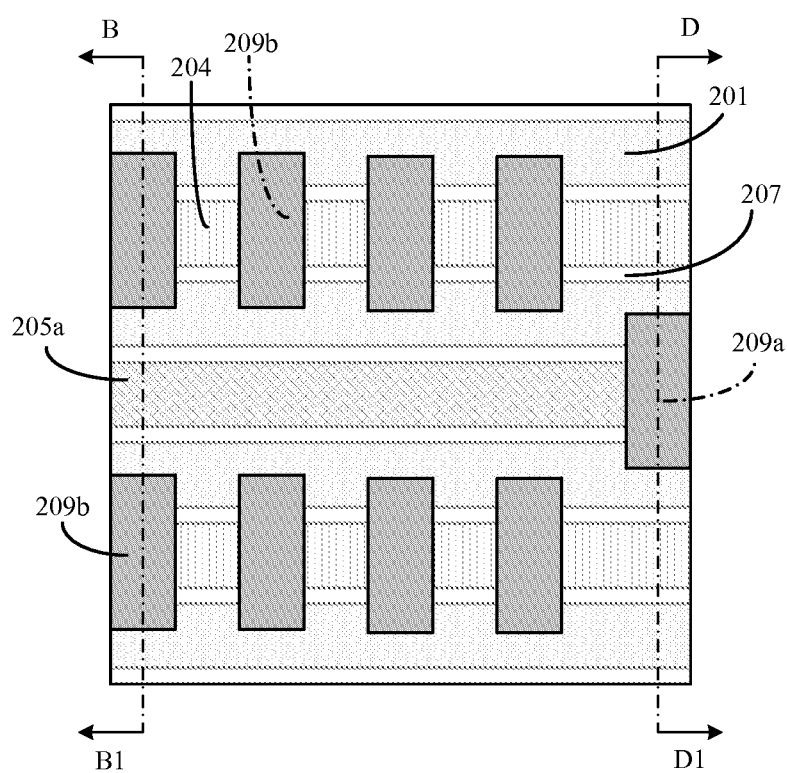
Figure 16:
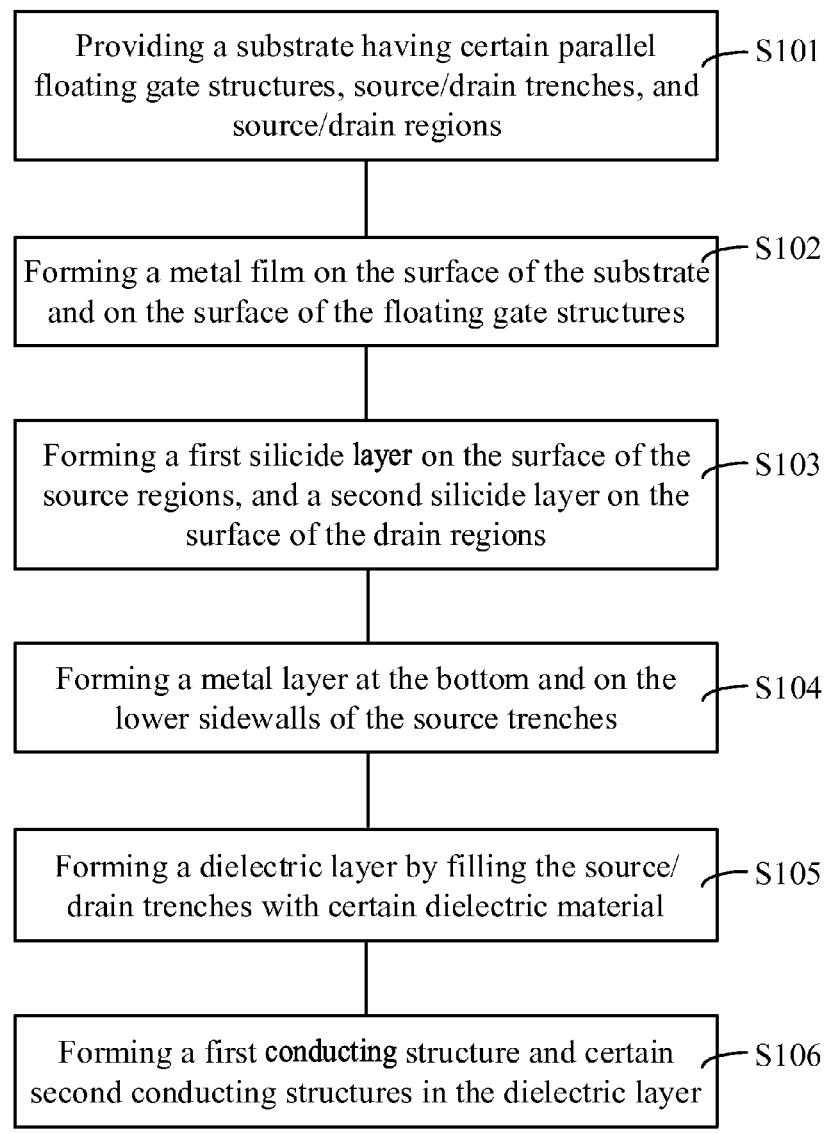
FIG. 16 illustrates a flow chart of an exemplary flash memory fabrication method consistent with the disclosed embodiments.

FIG. 16 illustrates a flow chart of an exemplary flash memory fabrication method consistent with the disclosed embodiments. FIGS. 3-15 illustrate structures of an exemplary flash memory corresponding to certain stages of the fabrication process consistent with the disclosed embodiments.

Figure 3:
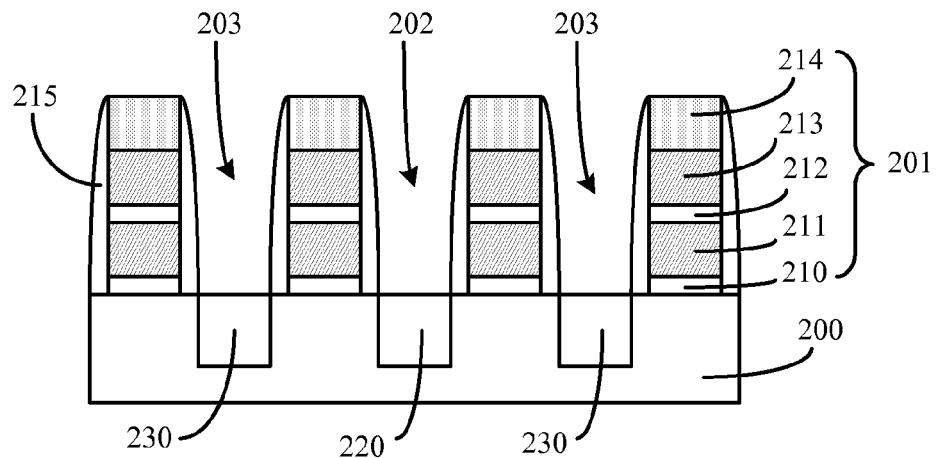
FIGS. 3-15 illustrate structures of an exemplary flash memory corresponding to certain stages of the fabrication process consistent with the disclosed embodiments.
Figure 4:
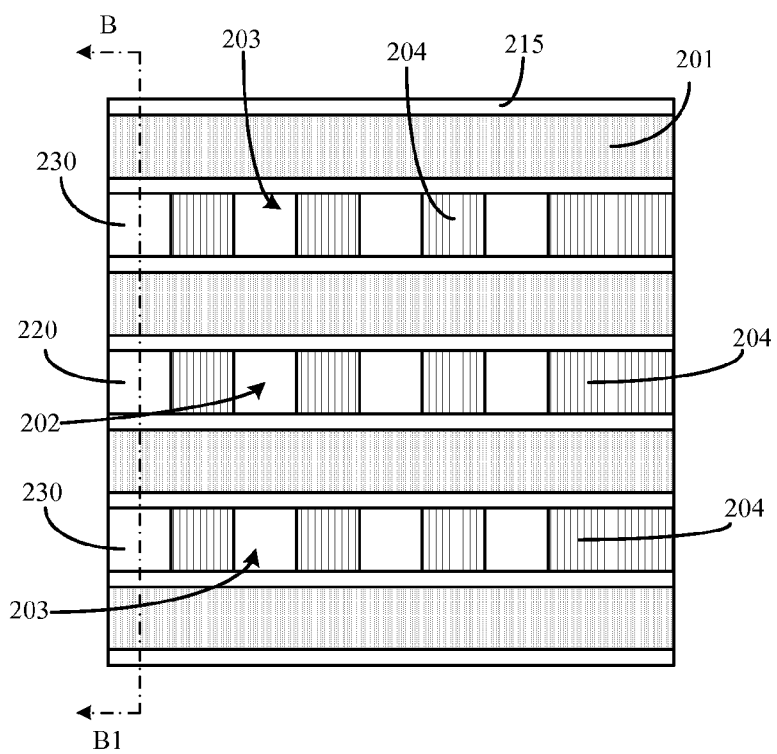

As shown in FIG. 16, at the beginning of the flash memory fabrication process, a substrate is provided (S101). FIG. 4 illustrates a top view of the exemplary flash memory corresponding to certain stage of the fabrication process consistent with the disclosed embodiment. FIG. 3 illustrates the B-B1 sectional view of FIG. 5.

As shown in FIGS. 3-4, a semiconductor substrate 200 is provided. The substrate 200 may be made of any appropriate semiconductor materials, such as silicon, silicon on insulator (SOI), germanium on insulator (GOI) silicon germanium, carborundum, indium antimonide, lead telluride, indium arsenide, indium phosphide, gallium arsenidie, gallium antimonite, or alloy semiconductor, etc. The substrate 200 may also be made of any appropriate dielectric material or insulation material, such as silicon oxide, silicon nitride, silicon oxynitride, or silicon carbonitride, etc. Further, the substrate 200 may also be made of metal, or metal compounds, such as W, Al, Cu, Ti, Ta, Co, TaN, NiSi, CoSi, TiN, TiAl or TaSiN, etc. Further, the substrate 200 may be other appropriate to-be-etch material. In one embodiment, the substrate may be made of silicon.

The substrate 200 may contain certain parallel floating gate structures 201. Further, certain trenches are located between these floating gate structures 201, wherein, the trenches may include at least one source trench 202 and one drain trench 203. The source trench 202 and the drain trench 203 may be arranged in an alternating way. That is, the source trench 202 and the drain trench 203 may occur alternatively one after the other.

Further, certain source regions 220 may be formed in the substrate 200 at the bottom of the source trench 202. Certain insulation structures 204 may be formed between adjacent source regions 220. Certain drain regions 230 may be formed in the substrate 200 at the bottom of the drain trench 203. Certain insulation structures 204 may be formed between adjacent drain regions 230. Besides, one source region 220 located inside of the source trench 202 may have one corresponding drain region 230 located inside of the adjacent drain trench 203.

The floating gate structures 201 may serve as storage units and may be used to form the ETOX NOR flash memory. The floating gate structure 201 may further include a first dielectric layer 210 located on the surface of the substrate 200; a floating gate (FG) layer 211 located on the surface of the first dielectric layer 210; a second dielectric layer 212 located on the surface of FG layer 211; a control gate (CG) layer 213 located on the surface of the second dielectric layer 212; and a first mask layer 214 located on the surface of the CG layer 213.

More specifically, the FG layer 211 and the CG layer 213 may be made of polysilicon. The first dielectric layer 210, the second dielectric layer 212, and the first mask layer 214 may be made of silicon oxide, silicon nitride, silicon oxynitride, or a combination thereof. The first layer 214 and the subsequently formed dielectric layers may be made of different materials. The CG layer 213 may have certain silicide material on surface or inside, which may be used to increase the current density in the CG layer 213.

In one embodiment, the first dielectric layer 210 may be made of silicon oxide, and may work as a tunnel oxide layer. Electrons may transfer from/to the source/drain regions in the substrate 200 to/from the FG layer 211 through the first dielectric layer 210 to realize the writing, erasing, and coding functions. The FG layer 211 may store the electrons during a power off status, which is the origin of the nonvolatile property of the flash memory.

The second dielectric layer 212 may be used to insulate the FG layer 211 from the CG layer 213. The second dielectric layer 212 may further include a silicon oxide layer, a silicon nitride layer located on the surface of the silicon oxide layer, and another silicon oxide layer located on the surface of the silicon nitride layer. That is, the second dielectric layer 212 may have a silicon oxide-silicon nitride-silicon oxide (ONO) structure. The ONO structure may have a desired insulation capability, and may also have a good adhesion to the polysilicon material. The CG layer 213 may be used to apply an offset voltage to the FG layer 211. The writing, erasing and coding operations of the FG layer 211 may be controlled by different offset voltages.

Further, the process for forming the floating gate structure 201 may include forming a first dielectric layer on the surface of the substrate 200; forming a first polysilicon layer on the surface of the first dielectric layer; forming a second dielectric layer on the surface of the first polysilicon layer; forming a second polysilicon layer on the surface of the second dielectric layer; and forming the first mask layer 214 on the surface of the second polysilicon layer.

The first mask layer 214 may cover the locations where the floating gate structure 201 to be formed. The process for forming the floating gate structure 201 may further include etching the second polysilicon layer, the second dielectric layer, the first polysilicon layer and the first dielectric layer by an anisotropic drying etching process until the surface of the substrate 200 is exposed. Moreover, the first mask layer 214 may protect the top surface of the CG layer 213 during the subsequent the first conducting structure and the second conducting structure formation process, where the first conducting structure and the second conducting structure may be located on the surface of the substrate 200 between adjacent floating gate structures 201. And the CG layer 213 may electrically insulated from the first conducting structure and the second conducting structure.

In addition, a spacer layer 215 may be formed on the sidewalls of the floating gate structure 201. The spacer layer 215 may be made of silicon oxide, silicon nitride, silicon oxynitride, or a combination thereof. Further, the spacer layer 215 may be made of a different material compared to the subsequently formed dielectric layers. Thus the sidewalls of the floating gate structure 201 may be protected during the first conducting structure and the second conducting structure formation process.

As shown in FIG. 4, after forming the floating gate structure 201 and the spacer layer 215, an ion implantation process may be used to form the source regions 220 located at the bottom of the source trench 202 and the drain regions 230 located at the bottom of the drain trench 203 in the substrate. The material used for the ion implantation process may be P type or N type. If the N type doping is used to form the source regions 220 and the drain regions 230, the carriers are electrons. Electrons may have a higher mobility, thus, the flash memory may have a better performance.

Figure 5:
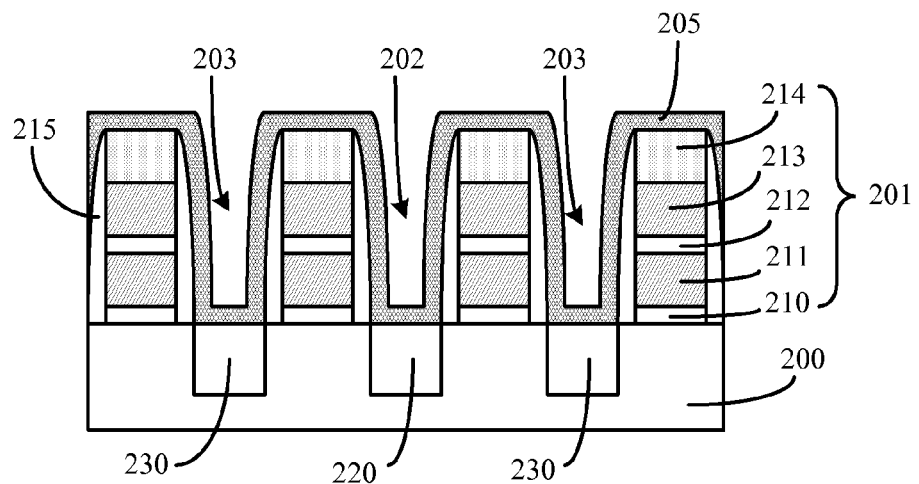
Figure 6:
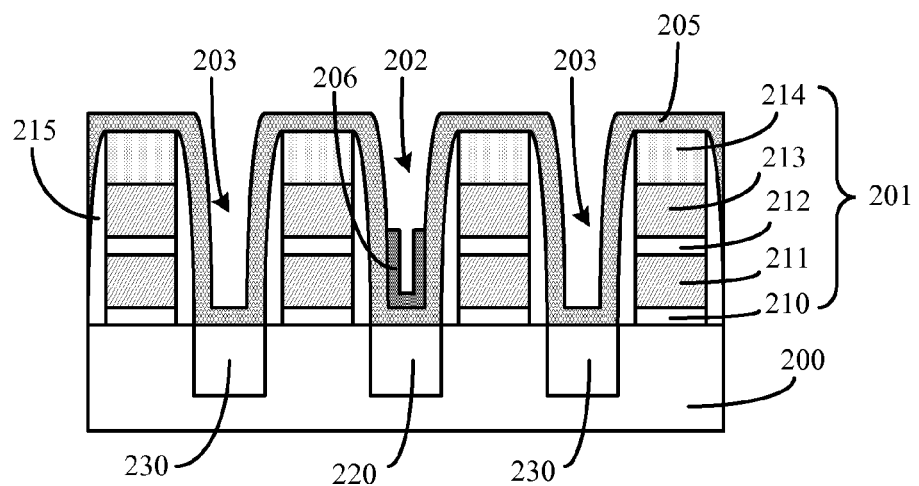
Figure 7:
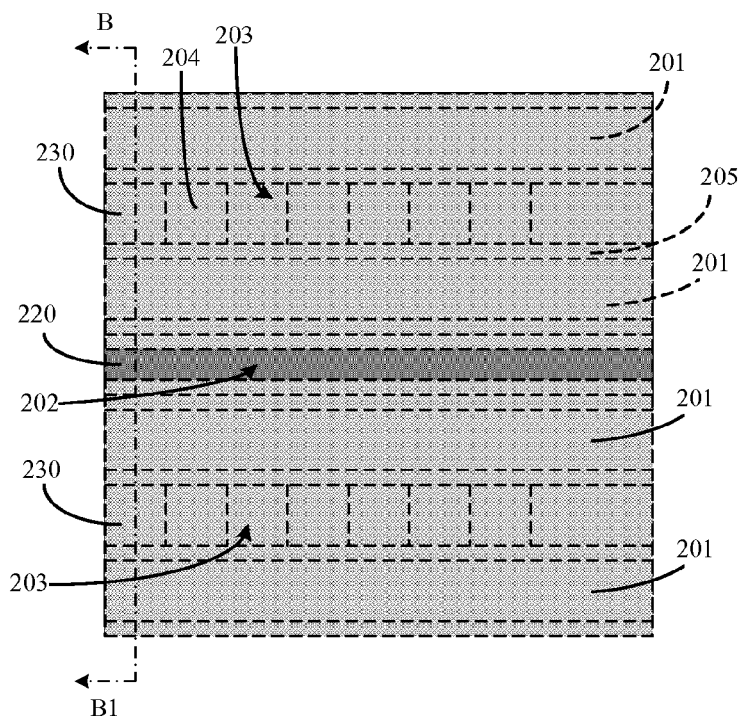
Figure 8:
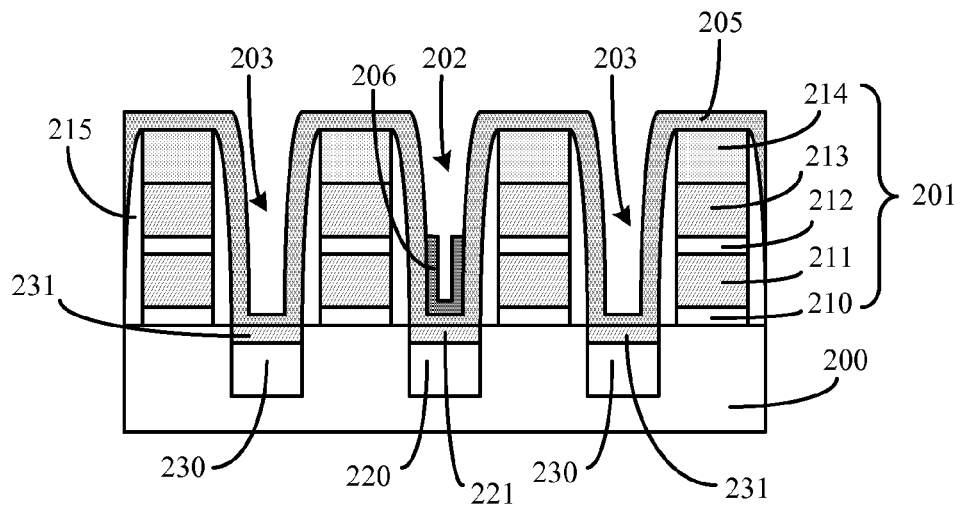

Returning to FIG. 16, after the substrate with various structures are provided (S101), a metal film is formed on the surface of the substrate and on the surface of the of the floating gate structures (S102). FIGS. 5-7 show an exemplary flash memory structure corresponding to certain stages of the fabrication process.

As shown in FIG. 5, a metal film 205 is formed on the surface of the substrate 200 and on the surface of the floating gate structure 201. The metal film 205 may be used to form a silicide layer later located on the surface of the source regions 220 and drain regions 230. The formed silicide layer may reduce the contact resistance on the surface of the source regions 220 and drain regions 230. Further, the metal film 205 may be made of nickel, cobalt, titanium, titanium nitride, tantalum, tantalum nitride, or a combination thereof. And the metal film 205 may be formed by a chemical liquid deposition process, a chemical vapor deposition process, a physical vapor deposition process, or a combination thereof.

In one embodiment, the metal film 205 may be made of nickel through a chemical liquid deposition process. More specifically, the reactant solution used in the chemical liquid deposition process may include $NiSO_4$, or $NiSO_4$ with certain $(NH_4)_2SO_4$, $NH_4F$, $C_6H_5Na_3O_7$, or a combination thereof. The molar concentration of the reactant $NiSO_4$ solution may range from 0.01 mol/L to 1 mol/L. The PH value of the reaction solution may range from 8 to 10. The deposition time may range from 30 seconds to 3000 seconds. And the deposition temperature may range from 0° C. to 90° C.

Further, the metal film 205 located at the bottom and on the lower sidewalls of the source trench 202 may be used to form a metal layer during the subsequent fabrication process. And the metal layer may work as a source wire which may connect certain source regions 220 located at the bottom of the source trench 202 together. The thickness of the metal film 205 may need to be relatively thicker, thus after an annealing process, there may be enough residual metal film 205 left at the bottom of the source trench 202. For example, the thickness of the metal film 205 may range from 50 angstroms and 300 angstroms.

FIG. 7 illustrates the top view of an exemplary flash memory corresponding to certain stage of the fabrication process. FIG. 6 illustrates the B-B1 sectional view of the FIG. 7.

As shown in FIGS. 6-7, a second mask layer 206 is formed on the surface of the metal film 205. The second mask layer 206 may selectively expose the metal film 205 that located on the top surface of the floating gate structure 201, on the bottom and sidewalls of the drain trench 203, and on the upper sidewalls of the source trench 202.

Further, the second mask layer 206 may serve as a protective layer for etching the metal film 205 after a subsequent annealing process. After etching, a metal layer located at the bottom and on the lower sidewalls of the source trench 202 may be formed, which may be used as a source wire. The material of the second mask layer 206 may have a high density, high mechanical strength, and ease of removal. For example, the second mask layer 206 may be made of silicon oxide, with a thickness ranging from 10 angstroms to 300 angstroms.

In addition, the process for forming the second mask layer 206 may include forming a second mask material film on the surface of the metal film 205; forming a bottom anti-reflective coating (BARC) layer on the surface of the second mask material film; etching back the BARC layer to lower its height to below the top surface of the floating gate structure 201. The process for forming the second mask layer 206 may further include etching the second mask material film with the BARC layer obtained after the etching back process as a mask until the surface of the metal film 205 is exposed; removing the BARC layer and the second mask material film located inside the drain trench 203 to form the second mask layer 206 located inside of the source trench 202.

More specifically, the BARC layer may serve as a mask for etching the second mask material film, which may define the metal layer patterns that to be formed at the bottom of the source trench 202. The BARC layer and the second mask material film may be made of different materials. Further, the BARC etching back process may use an anisotropic dry etching process. The second mask layer material film may be made of PEOX, TEOS, HTO, or LTO. And the second mask material film may be formed by a plasma enhanced chemical vapor deposition (PECVD) process, a tetra ethyl orthosilicate (TEOS) based chemical vapor deposition process, a high temperature oxidation process, or a low temperature oxidation process.

Moreover, the process for removing the BARC layer and the second mask material film located inside the drain trench 203 may include forming a photoresist layer on the surface of the second mask material film and the BARC layer, where the photoresist layer may expose the BARC layer located inside the drain trench 203; etching the BARC layer located inside the drain trench 203 with the photoresist layer as a mask until the second mask material film is exposed. Then the photoresist layer may be removed.

The process for removing the BARC layer and the second mask material film located inside the drain trench 203 may further include etching the second mask material film by using the BARC layer located inside the source trench 202 as a mask until the surface of the floating gate structure and the surface of the substrate located inside the drain trench 203 is exposed, thus forming the second mask layer 206. And finally the BARC layer located in the source trench 202 is removed after forming the second mask layer 206.

In certain embodiments, process for forming the second mask layer 206 may include forming a second mask material film on the surface of the metal layer 205; forming a BARC layer inside the source trench 202 by a photolithography process; etching back the BARC layer to lower its height to below the top surface of the floating gate structure 201; etching the second mask material film with the BARC layer as a mask until the surface of the metal film 205 is exposed. Thus, the second mask layer 206 is formed, and the BARC layer may be removed after forming the second mask layer 206.

Figure 9:
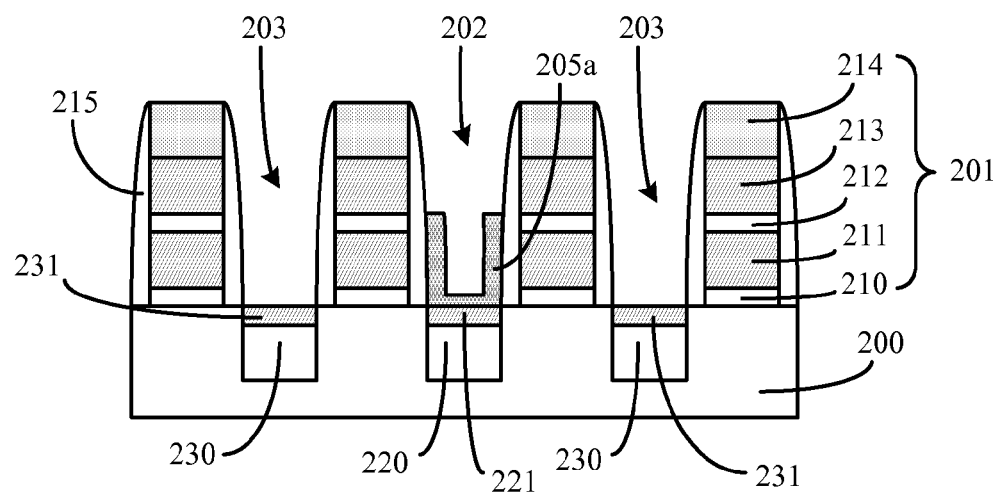

Returning to FIG. 16, a first silicide layer is formed on the surface of the source regions, and a second silicide layer is formed on the surface of the drain regions through a thermal annealing process (S103). FIG. 9 shows an exemplary flash memory structure corresponding to certain stages of the fabrication process.

As shown in FIG. 9, a first silicide layer 221 may be formed on the surface of the source region 220, and a second silicide layer 231 may be formed on the surface of the drain region 230. The first silicide layer 221 and the second silicide layer 231 may be formed by an annealing process, during which metal atoms in the metal film 205 may diffuse into the substrate 200.

More specifically, the annealing process for forming the first silicide layer 221 and the second silicide layer 231 may include a rapid thermal annealing, a spike thermal annealing and/or a laser thermal annealing. When using the rapid thermal annealing process, the annealing temperature may be set between 200° C. and 500° C. with an annealing time ranging from 10 seconds to 120 seconds. Further, the rapid thermal annealing process may be protected by nitrogen and/or other inert gases. When using the laser thermal annealing process, the annealing temperature may be set between 500° C. to 900° C. with an annealing time ranging from 0.1 milliseconds to 0.2 milliseconds. Similarly, the laser thermal annealing process may be protected by nitrogen and/or other inert gases. The thickness of the silicide layer 221 and the silicide layer 231 may increase as the annealing time increases.

Moreover, during the annealing process, metal atoms in the metal film 205 may diffuse into the contacted source regions 220, drain regions 230, and the substrate 200. The disused metal atoms may combine with the silicon material in the substrate 200 and may form certain metal silicide compounds. The material of the first silicide layer 221 and the second silicide layer 231 may include nickel silicide, cobalt silicide, titanium silicide, tantalum silicide or a combination thereof. The silicide layers 221 and silicide layers 231 may reduce the surface resistance of the source regions 220 and the drain regions 230, thus may increase the current density, and may improve the performance of the flash memory.

In certain embodiments, the metal film 205 may be relatively thick. Thus, after the annealing process, certain residual metal film 205 may be left at the bottom of the source trench 202. The residual metal film 205 may be used to form a source wire of the flash memory. Further, because the spacer layer 215 located on the surface of the sidewalls of the FG layer 211, the metal atoms in the metal film 205 may not diffuse into the FG layer 211. Thus, the thickness of the metal film 205 located on the lower sidewalls of the source trench 202 may keep constant. And the metal film 205 located on the lower sidewalls of the source trench 202 may also serve as the source wire.

In certain embodiments, the metal film 205 located at the bottom of the source trench 202 may be consumed completely during the thermal annealing process. Thus, the latterly formed metal layer may include only the partial metal film that is left on the lower sidewalls of the source trench 202.

In certain embodiments, the second mask layer may be formed on the surface of the residual metal layer no before the annealing process, but after the annealing process. The second mask layer may expose the metal film located on the top surface of the floating gate structure, on the sidewalls and at bottom of the drain trench, and on the upper sidewalls of the source trench. The second mask layer forming process may be similar to the second mask layer 206 forming process shown in FIG. 9, the detail of which is omitted here.

Further, returning to FIG. 16, a metal layer may be formed at the bottom and on the lower sidewalls of the source trenches (S104). The metal layer may be formed by selectively removing the metal film located on the top surface of the floating gate structure, on the sidewalls and at the bottom of the drain trenches, and on the upper sidewalls of the source trenches, while keeping the metal film located on the lower sidewalls of the source trenches after the thermal annealing process. The formed metal layer may contact with the surface of the first silicide layer located at the bottom of the source trenches.

Figure 10:
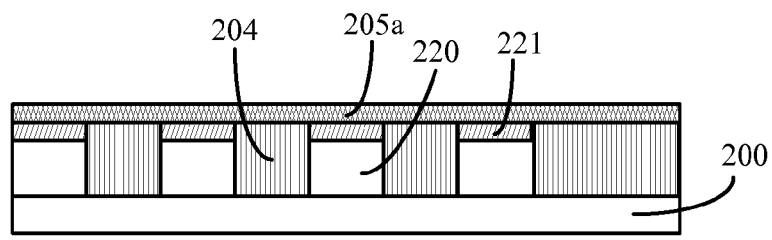
Figure 11:
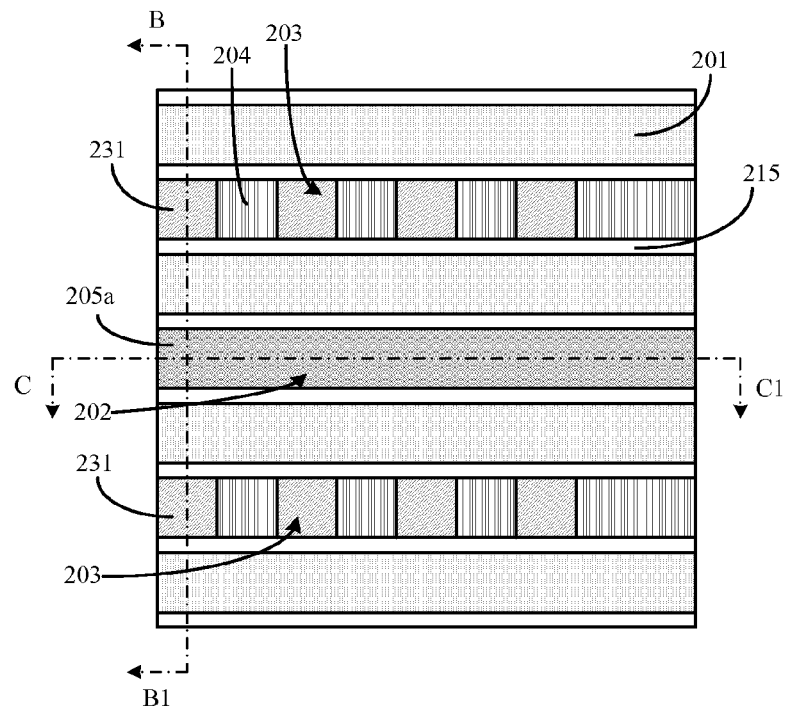

FIGS. 9-11 show an exemplary flash memory structure corresponding to certain stages of the fabrication process. FIG. 11 illustrates a top view of a flash memory structure corresponding to certain stage of the fabrication processes; FIG. 9 illustrates the B-B1 sectional view of FIG. 11; and FIG. 10 illustrates the C-C1 sectional view of FIG. 11.

As shown in FIGS. 9-11, a metal layer 205a may be formed by selectively etching the metal film 205 (shown in FIG. 8) that located on the top surface of the floating gate structure, on the bottom and sidewalls of the drain trench, and on the upper sidewalls of the source trench with the second mask layer 206 working as a protective layer. The metal layer 205a may contact with the first silicide layers 221 located at the bottom of the source trench 202. After forming the metal layer 205a, the second mask layer 206 may be removed.

More specifically, the etching process for selectively removing the metal film 205 may include an isotropic dry etching process and/or an isotropic wet etching process. Because the metal film 205 may cover not only the surface of the substrate 200, the first silicide layer 221, and the second silicide layer 231, but also the sidewalls and the top surface of the floating gate structure 201, the isotropic etching process which may have the same etching rate along every directions may be used to selectively remove the metal film 205.

In certain embodiments, the isotropic wet etching process may be used to etch the metal film 205. The etchant for the isotopic wet etching process may be an SC-1 solution, which may contain deionized water (DI water), hydrogen peroxide ($H_2O_2$) and aqueous ammonia ($NH_4OH$). The SC-1 solution may be able to remove the metal film 205, and may also be able to remove residuals from prior fabrication steps.

More specifically, the volume ratio between the DI water and the aqueous ammonia may range from 5:1 to 5:0.25. The volume ration between the hydrogen peroxide and aqueous ammonia may range from 1:1 to 1:0.25. And the volume ratio between the deionized water and the hydrogen peroxide may be 5:1. The temperature of the wet etching process may range from 10° C. to 80° C. When the wet etching temperature is higher (e.g., 60° C.~80° C.), the SC-1 solution may be able to remove certain naturally formed oxide layers.

Further, after the annealing process, the metal film 205 may be not completely consumed. Thus, the surface of the first silicide layer 221 and the second silicide layer 231 may have certain residual metal film 205 left. Thereby, the formed partial metal layer 205a may be located on the surface of the first silicide layer 221. The partial metal layer 205a may have a large contact area and good adhesion stability with the first silicide layer 221.

To remove the second mask layer 206, an isotropic dry etching process or an isotropic wet etching process may be used. In one embodiment, the second mask layer 206 may be made of silicon oxide, and a wet etching process may be used to remove the silicon oxide. The etchant for the wet etching process may be a hydrofluoric acid solution.

In certain embodiments, the second mask layer may be not formed either before or after the annealing process. In these scenarios, a BARC layer may be formed on the surface of the metal film 205 after the annealing process. Then the BARC layer located inside the drain trench 203 may be removed by a photolithography process, and may form a BARC layer inside the source trench 202. Next, a back etching process may be used to etch the BARC layer, which may lower the height the of the BARC layer to below the top surface of the floating gate structure 201. Then, the metal layer 205a may be formed by etching the metal film 205 with the BARC layer working as a protective mask until the surface of the substrate 200 and the partial surface of the gate structure 201 is exposed.

Figure 12:
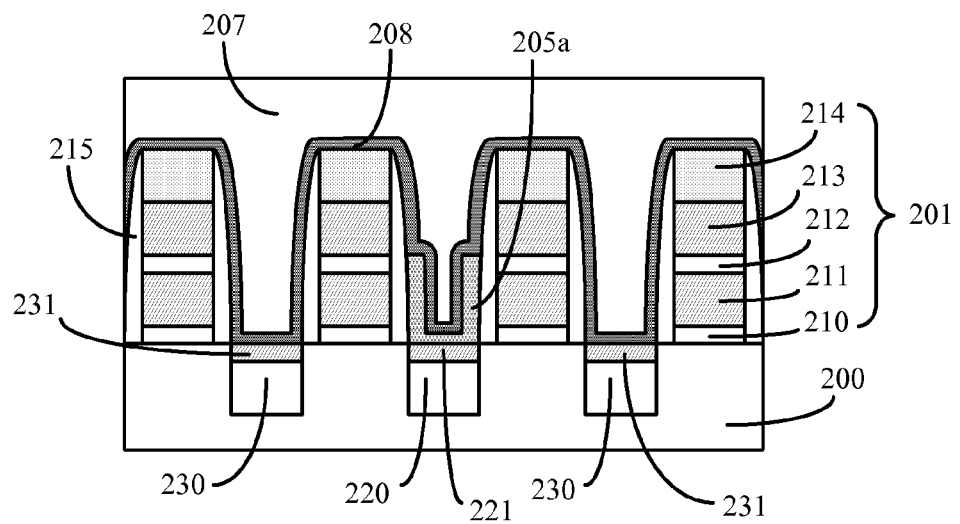

Further, returning to FIG. 16, a dielectric layer may be formed on the surface of the substrate and on surface the floating gate structures (S105). The dielectric layer may be formed by full filling the source trenches and the drain trenches with certain dielectric materials after the selective metal film removing process. FIG. 12 shows an exemplary flash memory structure corresponding to certain stages of the fabrication process.

As shown in FIG. 12, a dielectric layer 207 is formed after removing the second mask layer 206. The dielectric layer 207 may fill the source trench 202 (shown in FIG. 10) and the drain trench 203 (shown in FIG. 10). The dielectric layer 207 may electrically insulate certain floating gate structures 201. The dielectric layer 207 may be made of silicon oxide, silicon nitride, silicon oxynitride, low K dielectric materials, ultra-low K dielectric materials, or a combination thereof. Further, the dielectric layer 207, the spacer layer 215, and the first mask layer 214 may be made of different materials.

Further, a stop layer 208 may be formed prior forming the dielectric layer 207. The stop layer 208 may be located on the surface of the substrate 200, the second silicide layer 231, the metal layer 205a, the spacer 215, and the floating gate structure 201. The dielectric layer 207 may be formed on the surface of the stop layer 208. And the stop layer 208 and the dielectric layer 207 may be made of different materials. For example, the stop layer 208 may be made of silicon nitride. The stop layer 208 may be used to define the stop position of a first opening and a second opening that to be formed later.

More specifically, the process for forming the dielectric layer 207 may include forming a dielectric film through a deposition process. The dielectric film may be located on the surface of the substrate 200, the second silicide layer 231, the metal layer 205a, the spacer layer 215 and the floating gate structure 201. And the dielectric film may fill the source trench 202 and the drain trench 203. Further, the dielectric layer 207 may be formed by planarizing the dielectric film by a chemical mechanical polishing process. The deposition process used to form the dielectric film may be a chemical vapor deposition process and/or a physical vapor deposing process. Further, the stop layer 208 may also be formed by a chemical vapor deposition process and/or a physical vapor deposition process.

Returning to FIG. 16, further, a first conducting structure and certain second conducting structures may be formed in the dielectric layer (S106). The first conducting structure may be located on the surface of the metal layer inside the source trenches, and the second conducting structures may be located on the surface of the second silicide layer inside the drain trenches. Moreover, the adjacent first conducting structure and second conducting structure may have a predefined distance.

Figure 13:
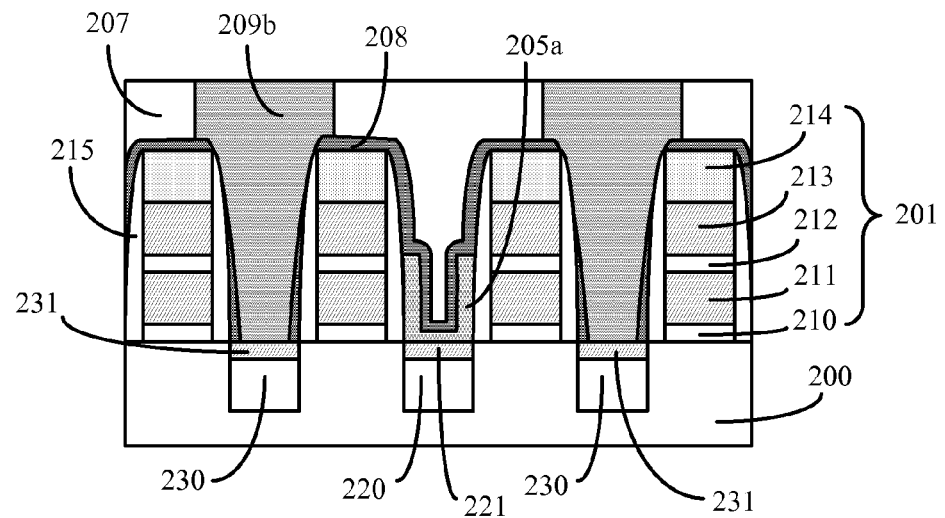
Figure 14:
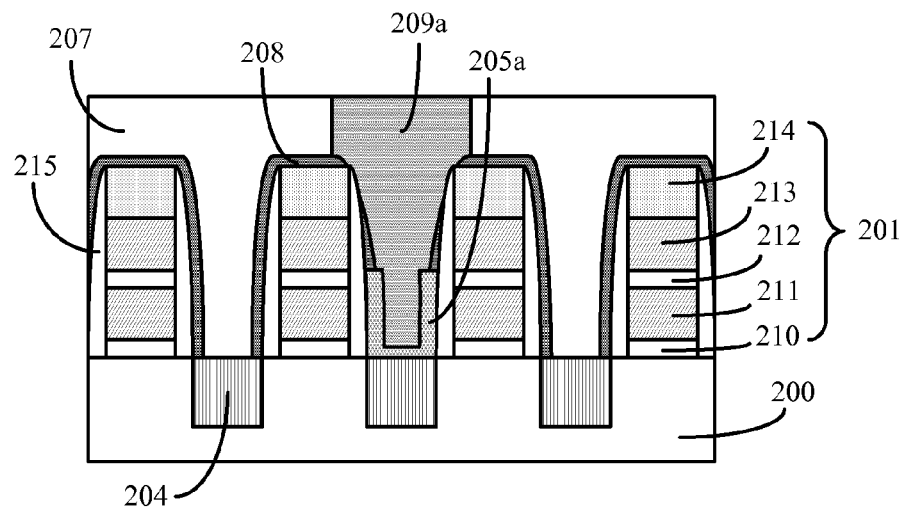

FIGS. 13-15 show an exemplary flash memory structure corresponding to certain stages of the fabrication process. FIG. 15 illustrates a top view of a flash memory structure corresponding to certain stage of the fabrication process, FIG. 13 illustrates the B-B1 sectional view of FIG. 15, and FIG. 14 illustrates the D-D1 sectional view of FIG. 15.

As shown in FIGS. 14-16, a first conducting structure 209a and certain second conducting structures 209b are formed in the dielectric layer 207. Further, the first conducting structure 209a may be located on the surface of the metal layer 205a inside the source trench 202. And the second conducing structures 209b may be located on the surface of the second silicide layer 231 inside the drain trench 203. Moreover, the first conducting structure 209a and the second conducting structures 209b located inside two adjacent source trench 202 and drain trench 203 may maintain a predefined distance.

Further, the first conducting structure 209a and the second conducting structures 209b may be formed by a self-aligned process. More specifically, the process may include forming a first opening and certain second openings by selectively etching the dielectric layer 207. The first opening may expose the partial metal layer 205a located at the bottom of the source trench 202, and may also expose the sidewalls of the floating gate structure 201 inside the source trench 202. The second openings may expose certain second silicide layers 231 located at the bottom of the drain trench 203, and also expose sidewalls of the drain trench 203. Further, the first conducting structure 209a may be formed by filling the first opening with certain conductive material, and the second conducting structures may be formed by filling the second openings with certain conductive material. The first conducting structure 209a and the second conducting structures 209b may be formed together.

More specifically, the first conducting structure 209a and the second conducting structures 209b forming process may include forming a conductive layer inside the first opening and the second openings by full filling the first openings and the second openings with certain conductive materials; forming the first conducting structure 209a with the conductive layer inside the first opening and forming the second conducting structures 209b with the conductive layer inside the second openings by a chemical mechanical polishing process performed on the surface of the dielectric layer 207. The conductive layer may be made of copper, tungsten, aluminum, or other proper materials through a process such as electroplating, chemical plating, physical vapor deposition, and chemical vapor deposition. Further, a stop layer may be deposited on the surface of the dielectric layer 207, the first opening, and the second openings prior the formation of the conducive layer. The stop layer may define the stopping position of the chemical mechanical polishing process. Then, the stop layer located on the surface of the dielectric layer 207 may be removed by another chemical mechanical polishing process or by another etching back process. The stop layer may be made of titanium, titanium nitride, tantalum, tantalum nitride or a combination thereof.

In addition, the stop layer 208 is located on the surface of the substrate 200, the second silicide layer 231, the metal layer 205a, the spacer layer 215, and the floating gate structure 201. Further, because the stop layer 208 may be formed prior to the formation of the dielectric layer 207, the subsequent dielectric layer 207 etching process may stop at the surface of the stop layer 208. Then, the stop layer 208 located at the bottom of the first opening and the second openings may be removed by a dry etching process or a wet etching process. Moreover, when using the wet etching process to remove the stop layer 208 located at the bottom of the first opening and the second openings, damages to the bottom first silicide layer 221 and the second silicide layer 231 may be avoided or relatively small. Thus, the stability of the flash memory may be improved.

Moreover, the first mask layer 214 may be located on the top surface of the CG layer 213, the spacer layer 215 may be located on the sidewalls of the floating gate structure 201, and the first mask layer 214, the spacer layer 205 may be made of different materials compared to the dielectric layer 207, thus, the process used to etch the dielectric layer 207 may have few damages to the first mask layer 214 and the spacer layer 215.

Thus, the first opening and the second openings may partially expose the sidewalls of the source trench 202 (as shown in FIG. 14), the sidewalls of the drain trench 203 (as shown in FIG. 13), and the top surface of the floating gate structure 201, while keeping the CG layer 213 and the FG layer 211 undamaged. Further, patterns formed between the tops of first opening and second openings may have a large dimension. The distance between the adjacent floating structures may be relatively small, and the accuracy of the lithography process may be guaranteed.

Further, the metal layer 205a located at the bottom and on the lower sidewalls of the source trench 202 may connect some of the first silicide layers 221 located at the bottom of the source trench 202 together. Thus, the metal layer 205a may serve as a source wire of the flash memory, and may be used to supply an offset voltage to the source regions 220.

Moreover, to enable supplying the offset voltage to the metal layer 205a, a first conducting structure 209a may need to be formed on the surface of the metal layer 205a. Further, the first conducting structure 209a and the second conducting structure 209b may have a predefined distance larger than 100 angstroms.

Because the relatively large distance between the top of the first conducting 209a and the second conducting structure 209b, the dielectric material layer 207 located between the top of the first conducting 209a and the second conducting structure 209b may be hard to generate electrical breakdown. Thus, the leakage current due to the electrical breakdown of the dielectric layer 207 located between the first conducting structure 209a and the second conducting structure 209b may be avoided.

Thus, in the disclosed flash memory fabrication method, by using a self-aligned silicide process, a first silicide layer may be formed on the surface of source regions, and a second silicide layer may be formed on the surface of drain regions. The formed first silicide layer and the second silicide layer may reduce the contact resistance on the surface of the source regions and the drain regions. After an annealing process belonging to the self-aligned silicide process, certain residual metal film may be left on the sidewalls and at the bottom of source trenches and drain trenches. The metal film may connect certain source regions located at the bottom of the source trenches together. Then, by removing the metal film located inside of the drain trenches, and keeping the metal film located at the bottom and on the lower sidewalls of the source trenches, a metal layer may be formed. The formed metal layer may connect certain source regions located at the bottom of the source trenches. Thus the metal layer may serve as source wires of the flash memory. Further, because the metal layer may have a relatively large distance from a second conducting structure located on the surface of the drain regions, and because the metal layer and the second conducting structure may be insulated by the floating gate structure, the electrical breakdown between the metal layer and the second conducting structure may be hard to happen. Thus, the leakage current between the source wires of the flash memory and the second conducting structure located on the surface of the drain regions may be avoided. Further, because the metal layer may already connect certain source regions located at the bottom of the source trenches together, the position of the first conducting structure that to be formed on the surface of the metal layer may be chosen freely. Thus, the first conducting structure and the second conducting structure may have a large distance. The leakage current due to the electrical breakdown of the dielectric material located between the top of the first conducting structure and the second structure may also be avoided. The formed flash memory may have an improved performance, reliability and stability. Further, because the source wires may be formed by using the residual metal film that is left during the self-aligned silicide process, the flash memory fabrication process may save certain steps, thus is simpler.

Accordingly, the present disclosure provides a flash memory that may be fabricated by the above illustrated flash memory fabrication method.

As shown in FIGS. 13-15, an exemplary flash memory consistent with the present disclosure may include a substrate 200; certain parallel floating gate structures 201 located on the surface of the substrate 200; certain trenches located between two adjacent floating gate structures 201, where the trenches may include at least one source trench and at least one drain trench.

The flash memory may further include certain source regions 220 in the substrate 200 located at the bottom of the source trench; certain insulation structures 204 located between the adjacent source regions 220, certain drain regions 230 in the substrate 200 located at the bottom of the drain trench 203; and certain insulation structures 204 located between the adjacent drain regions 230.

In addition, the locations of source regions 220 and drain regions 230 inside two adjacent source trench and drain trench may correspond to each other. The flash memory may further include a first silicide layer 221 located on the surface of the source regions 220; a second silicide layer 231 located on the surface of the drain regions 230; a metal layer 205a located at the bottom and on the lower sidewalls of the source trench; a dielectric layer 207 covering the surface of the substrate 200, the surface of the floating gate structure 201 and filling the source trench and the drain trench.

The flash memory may further include a first conducting structure 209a and certain second conducting structures 209b in the dielectric layer 207. In addition, the first conducting structure 209a may be located on the surface of the metal layer 205a inside the source trench; and the second conducting structures 209b may be located on the surface of the second silicide layer 231. The first conducting structure 209a and the second conducting structures 209b located inside two adjacent source trench and drain trench respectively may maintained certain predefined distance from each other.

Moreover, the floating gate structure 201 may further include a first dielectric layer 210 located on the surface of the substrate 200; a floating gate layer 211 located on the surface of the first dielectric layer 210; a second dielectric layer 212 located on the surface of the floating gate layer 211; a control gate layer 213 located on the surface of the second dielectric layer 212; and a first mask layer 214 located on surface of the control gate layer 213.

In addition, the floating gate structure 201 may have a spacer layer 215 located covering its sidewalls. The spacer layer 215 may be made of silicon oxide, silicon nitride, silicon oxynitride, or a combination thereof. The spacer layer 215 and the dielectric layer 207 may be made of different materials. The floating gate layer 211 and the control gate layer 213 may be made of polysilicon. The first dielectric layer 210, the second dielectric layer 212, and the first mask layer 214 may be made of silicon oxide, silicon nitride, silicon oxynitride, or a combination thereof. Besides, the first mask layer 214 and the dielectric layer 207 may be made of different materials. The metal layer 205a may be made nickel, cobalt, titanium, titanium nitride, tantalum, tantalum nitride, or a combination thereof. Further, there may be a stop layer 208 located between the dielectric layer 207 and the substrate 200, and located between the dielectric layer 207 and the floating gate structure 201. The stop layer 208 and the dielectric layer 207 may be made of different materials. The distance between the first conducting structure 209a and the second conducting structures 209b may need to be greater than 50 angstroms.

In one embodiment, the bottom and the lower sidewalls of the source trench may have a metal layer. The metal layer may connect certain source regions located at the bottom of the source trench together. That is, the metal layer may serve as a source wire of the flash memory. Because the metal layer may be located at the bottom of the source trench, the metal lay may have a relatively large distant from the second conducting structure located on the surface of the drain regions. Further, the metal layer and the second conducting structure may be insulated by the floating gate structure, thus, the dielectric material located between the metal layer and the second conducting structure may be difficult to generate electrical breakdown. Thus, the leakage current between the source wire of the flash memory and the second conducting structure located on the surface of the drain regions may be avoided.

In addition, the first conducting structure located on the surface of the metal layer may have an increased distance from the second conducting structure. Thus, the leakage current due to electrical break of the dielectric material located between the tops of the first conducting structure and the second structure may be avoided. The formed flash memory may have an improved performance, reliability and stability Other applications, advantages, alternations, modifications, or equivalents to the disclosed embodiments are obvious to those skilled in the art. It is intended that the specification and examples be considered as exemplary only, with a true scope and spirit of the invention being indicated by the claims.

What is claimed is:

1. An flash memory fabrication method, comprising:
   providing a substrate having a plurality of floating gate structures separated by trenches, including at least a source trench and a drain trench, wherein source regions are formed in the substrate at bottom of the source trench and drain regions are formed in the substrate at bottom of the drain trench;
   forming a metal film on the substrate and on the floating gate structures;
   performing a thermal annealing process on the metal film to diffuse metal ions of the metal film into the substrate to form a first silicide layer on the source regions and a second silicide layer on the drain regions;
   removing portions of the metal film to form a metal layer on the bottom and lower sidewalls of the source trench and contacting with the first silicide layer;
   forming a dielectric layer on the substrate and the floating gate structures, the dielectric layer covering the source trench and the drain trench; and
   forming a first conducting structure and one or more second conducting structures in the dielectric layer, wherein the first conducting structure is on a surface of the metal layer in the source trench, the second conducting structures are on a surface of the second silicide layer, and adjacent first conducting structure and second conducting structure have a predetermined distance.

2. The method according to claim 1, wherein removing portions of the metal film further includes:
   removing portions of the metal film on top of the floating gate structures, on sidewalls and the bottom of the drain trench, and on upper sidewalls of the source trench to form the metal layer on the bottom and lower sidewalls of the source trench.

3. The method according to claim 1, wherein:
the plurality of floating gate structures are parallel floating gate structures on the substrate;
the source trench and the drain trench are located between two adjacent floating gate structures; and
adjacent source regions or drain regions are separated by first insulation structures.

4. The method according to claim 2, wherein removing portions of the metal film further includes:
forming a mask layer on the metal film to expose the metal film on the top surface of the floating gate structures, on sidewalls and bottom of the drain trench, and on upper sidewalls of the source trench;
etching the metal film using the mask layer as a mask after the thermal annealing process to form the metal layer; and
removing the mask layer after forming the metal layer.

5. The method according to claim 4, wherein forming the mask layer further includes:
forming a mask material film on the metal film;
forming a bottom anti-reflective coating (BARC) layer on the mask material film;
etching back the BARC layer to lower a height of the BARC layer to below the top surface of the floating gate structures;
etching the second mask material film with the BARC layer as a mask to expose the metal film; and
removing the BARC layer and the mask material film in the drain trench to form the mask layer in the source trench.

6. The method according the claim 4, wherein forming the mask layer further includes:
forming a mask material film on the metal film;
forming a bottom anti-reflective coating (BARC) layer in the source trench using a photolithography process;
etching back the BARC layer to lower a height of the BARC layer to below the top surface of the floating gate structures;
etching the mask material film using the BARC layer as a mask until the surface of the metal film is exposed to form the mask layer; and
removing the BARC layer.

7. The method according to claim 4, wherein:
the second mask layer is made of PEOX, TEOS, HTO, or LTO using a plasma enhanced chemical vapor deposition process, a tetra ethyl orthosilicate (TEOS) based chemical vapor deposition process, a high temperature oxidation based process, or a low temperature based oxidation process.

8. The method according to claim 1, wherein removing portions of the metal film further includes:
forming a BARC film on the metal film after the annealing process;
removing the BARC film in the drain trench to form a BARC layer in the source trench using a photolithography process;
etching back the BARC layer to lower a height of the BARC layer to below the top surface of the floating gate structures; and
etching the metal film using the BARC layer as a mask to form the metal layer.

9. The method according to claim 1, wherein a floating gate structure includes:
a first dielectric layer formed on the substrate;
a floating gate layer formed on the first dielectric layer;
a second dielectric layer formed on the floating gate layer;
a control gate layer formed on the second dielectric layer; and
a first mask layer formed on the control gate layer.

10. The method according to claim 9, wherein:
a spacer layer is formed prior to forming the metal layer to cover sidewalls of the floating gate structures; and
the spacer layer is made of a different material from the dielectric layers, including one of silicon oxide, silicon nitride, and silicon oxynitride.

11. The method according to claim 1, wherein the first conducting structure and the second conducting structures are formed using a self-aligned process including:
forming a first opening and one or more second openings by selectively etching the dielectric layer, wherein the first opening exposes the metal layer located in the source trenches and partial sidewalls of the floating gate structures, and the second openings expose one or more the second silicide layers in the drain trench and partial sidewalls of the floating gate structures; and
filling the first opening and the second openings with a conductive material to form the first conducting structure and the second conducting structures, wherein the predefined distance between the first conducting structure and the second conducting structures is larger than 100 angstroms.

12. The method according to claim 11, wherein:
a stop layer made of a different material from the dielectric layer is formed prior to forming the dielectric layer on the substrate and floating gate structures; and
the dielectric layer is formed on the stop layer.

13. The method according to claim 9, wherein:
the floating gate layer and the control gate layer are made of poly silicon; and
the first dielectric layer, the second dielectric layer, and the first mask layer are made of silicon oxide, silicon nitride, or silicon oxynitride, different from the first dielectric layer and the second dielectric layer.

14. The method according to claim 1, wherein:
the metal layer is made of one of nickel, cobalt, titanium, titanium nitride, tantalum, and tantalum nitride.

* * * * *